United States Patent [19]

Fujii et al.

[11] Patent Number: 5,077,238

[45] Date of Patent: Dec. 31, 1991

[54] METHOD OF MANUFACTURING A SEMICONDUCTOR DEVICE WITH A PLANAR INTERLAYER INSULATING FILM

[75] Inventors: Atsuhiro Fujii; Toshihiko Minami; Hideki Genjo, all of Hyogo, Japan

[73] Assignee: Mitsubishi Denki Kabushiki Kaisha, Tokyo, Japan

[21] Appl. No.: 353,892

[22] Filed: May 18, 1989

[30] Foreign Application Priority Data

May 18, 1988 [JP] Japan ................. 63-122370
May 18, 1988 [JP] Japan ................. 63-122373
Apr. 21, 1989 [JP] Japan ................. 1-102701

[51] Int. Cl.⁵ .......................................... H01L 21/467
[52] U.S. Cl. ................................. 437/228; 437/235; 437/982; 148/DIG. 133
[58] Field of Search ................... 437/235, 982; 148/DIG. 133

[56] References Cited

U.S. PATENT DOCUMENTS

| | | | |
|---|---|---|---|
| 4,364,165 | 12/1982 | Dickman et al. | 437/235 |
| 4,535,528 | 8/1985 | Chen et al. | 437/982 |
| 4,666,553 | 5/1987 | Blumenfeld et al. | 156/643 |
| 4,799,992 | 1/1989 | Rao et al. | 156/643 |

FOREIGN PATENT DOCUMENTS

| | | | |
|---|---|---|---|
| 52-113162 | 9/1977 | Japan . | |
| 54-60558 | 6/1979 | Japan . | |
| 56-85829 | 3/1981 | Japan . | |
| 56-48140 | 11/1981 | Japan . | |
| 60-32974 | 4/1985 | Japan . | |
| 60-4224 | 10/1985 | Japan . | |
| 62-001232 | 7/1987 | Japan . | 437/982 |
| 62-79629 | 7/1987 | Japan . | |

OTHER PUBLICATIONS

S. Wolf and R. N. Tauber, *Silicon Processing for the VLSI Era*, Lattice Press, Sunset Beach, CA (1986), pp. 189-191.

R. A. Levy and K. Nassau, "Viscous Behavior of Phosphosilicate and Borophosphosilicate Glasses in VLSI Processing", *Solid State Technology* (1986), pp. 123-230.

*Primary Examiner*—Brian E. Hearn
*Assistant Examiner*—Laura M. Holtzman
*Attorney, Agent, or Firm*—Lowe, Price, LeBlanc and Becker

[57] ABSTRACT

A method of manufacturing a semiconductor device in which an element is flattened by improving a technique of forming an interlayer insulating film. A thick insulating film having a film thickness necessary for a convexo-concave pattern to be flattened is deposited on a semiconductor substrate comprising the convexo-concave pattern of an element, a wiring and the like. Then, the thick insulating film is etched until it becomes a predetermined film thickness to form an interlayer insulating film having a predetermined film thickness from said thick insulating film. At this time, since acid and water are attached on the surface of the interlayer insulating film, a new film is formed on the surface of the interlayer insulating film to cover this water and acid. Then, a resist pattern having a desired configuration is formed on this new film. A contact hole is formed on the interlayer insulating film using this resist pattern. Thereafter, a wiring pattern electrically connected to the element is formed on the interlayer insulating film through the contact hole. According to this method, since the acid and water attached on the interlayer insulating film are covered with the new film, the adhesion between the interlayer insulating film and the resist is improved. As a result, the contact hole can be opened reliably, whereby the element is surely connected to the wiring pattern and a semiconductor device can be provided with high reliability.

13 Claims, 12 Drawing Sheets

METHOD OF MANUFACTURING A SEMICONDUCTOR DEVICE WITH A PLANAR INTERLAYER INSULATING FILM

BACKGROUND OF THE INVENTION

1. Field of the Invention

The present invention relates to a method of manufacturing a semiconductor device and, more particularly, to the improvement of a method of forming a flattened interlayer insulating film on a semiconductor substrate comprising a convexo-concave pattern of an element, a wiring and the like.

2. Description of the Background Art

A semiconductor device technique has already reached a submicron region and a 4MDRAM is about to be implemented by design rule of approximately 0.8 μm. At the same time of miniaturization, the configuration of the device pattern becomes complicated, the difference between step portions becomes considerably large and an aspect ratio becomes higher. Under such a condition, a flattening technique plays an important part at present.

FIGS. 8A to 8I are sectional views of steps of manufacturing a semiconductor device employing a conventional flattening technique.

Referring to FIG. 8A, a semiconductor substrate 1, for example a silicon semiconductor substrate is prepared. Then, referring to FIG. 8B, a silicon oxide film 2 serving as a gate oxide film is formed on the semiconductor substrate 1. A polysilicon layer 3 serving as a gate electrode is formed on the silicon oxide film 2. Then, phosphorus is doped on the polysilicon layer 3 to increase conductivity Instead of doping phosphorus, polysilicon doped with phosphorus or arsenic may be deposited on the silicon oxide film 2.

Referring to FIGS. 8B and 8C, a gate oxide film 4 and a gate electrode 5 are formed on the semiconductor 10 substrate 1 by patterning the silicon oxide film 2 and the polysilicon layer 3 into desired configurations.

Referring to FIG. 8D, in order to form a source-drain region 6 on the main surface of the semiconductor substrate 1, impurity ions 7 of B+, P+ or As+ are implanted in the main surface of the semiconductor substrate. The concentration of the impurity ions is approximately $1 \sim 2 \times 10^{20}$ atom/cm$^3$.

Thereafter, referring to FIG. 8E, an interlayer insulating film 8 formed of a silicon oxide film comprising impurities such as boron, phosphorus, arsenic and the like is deposited on the semiconductor substrate 1 comprising a gate electrode 5. Referring to FIG. 8F, in order to flatten the surface of the interlayer insulating film 8, heat treatment, called reflow, is given at a temperature of approximately 700°~1000° C. By this reflow treatment, the surface of the interlayer insulating film 8 is flattened.

Referring to FIG. 8G, a resist 9 is applied to the whole surface and patterned such that an opening portion may be formed on an upper portion of a contact region to be formed. Then, a contact hole 10 is formed in the interlayer insulating film 8 by etching the interlayer insulating film 8, using the patterned resist 9 as a mask. Thereafter, the resist 9 is removed.

Then, referring to FIG. 8H, in order to enhance electric conductivity at a contact region 11, impurity ions 12 of B+, P+, As+ and the like are implanted in the contact region 11.

Referring to FIG. 8I a wiring pattern 13 electrically connected to the source/drain region 6 is formed on the interlayer insulating film 8 through the contact hole 10.

The above-described method is the most standard technique of flattening the interlayer insulating film.

However, there is a disadvantages in the technique of flattening the interlayer insulating film that the concentration of impurities implanted in the interlayer insulating film 8 as shown in FIG. 8F is high, and the temperature at the reflow treatment is also high, so that the impurities implanted in the interlayer insulating film 8 are diffused over the gate electrode 5, other wiring layers and the like.

In order to solve this disadvantage, an improved technique for flattening the interlayer insulating film, shown in FIGS. 9A to 9F, is disclosed in Japanese Patent Laying-Open Gazette No. 48140/1988.

Referring to FIG. 9A, a LOCOS oxide film 14, a gate oxide film 4, a gate electrode 5, a source/drain region 6 are formed on the main surface of a semiconductor substrate 1. Referring to FIG. 9B, a silicon oxide film 15a comprising phosphorus of $4 \times 10^9$ atom/cm$^3$ is deposited on the whole surface of the semiconductor substrate 1 and a silicon oxide film 15b comprising phosphorus of $1 \times 10^{10}$ atom/cm$^3$ is deposited thereon. Then, a thick insulating film 16 formed of the silicon oxide films 15a and 15b is formed. Thereafter, referring to FIG. 9C, heat treatment, called reflow, is given for 30 minutes in a nitride atmosphere at 1000° C. By this reflow treatment, the surface of the thick insulating film 16 is flattened.

Referring to FIGS. 9C and 9D, by etching the thick insulating film 16 until it becomes a predetermined film thickness, an interlayer insulating film 8 having a predetermined film thickness is formed out of the thick insulating film 16. Thereafter, a portion 17 damaged by the above etching is etched away using acid such as boric acid, phosphoric acid, hydrofluoric acid and the like. Thereafter, referring to FIG. 9E, a resist 9 is applied to the whole surface and then patterned.

Referring to FIGS. 9E and 9F, a contact hole 10 is provided in the interlayer insulating film 8 using the patterned resist 9 as a mask to form a wiring pattern 13.

According to the above-described improved technique, the concentration of impurities implanted in the insulating film 16 can be decreased and the temperature at 10 the reflow treatment can be lowered. However, the reflow treatment is inevitably required in order to flatten the insulating film 16 in the above-described improved technique also. Since the reflow treatment is given at a high temperature of 1000° C., the impurities implanted in the insulating film 16 are somewhat diffused over the wiring layer and the like. Therefore, this improved technique cannot perfectly prevent the impurities implanted in the insulating film 16 from diffusing by heat over the wiring layer and the like. In addition, referring to FIG. 9D, there is a disadvantage in this improved technique that boric acid, phosphoric acid, hydrofluoric acid and the like which were used in etching is soaked in the surface of the interlayer insulating film 8, so that they are left. If acid is left on the surface layer of the interlayer insulating film, the adhesion between the photoresist 9 and the interlayer insulating film 8 is lowered, causing processing precision to be lowered.

SUMMARY OF THE INVENTION

An object of the present invention is to provide a method of manufacturing a semiconductor device capable of flattening an interlayer insulating film without diffusing impurity ions in a wiring layer and the like.

Another object of the present invention is to provide a method of manufacturing a semiconductor device capable of improving processing precision.

A further object of the present invention is to provide a method of manufacturing a semiconductor device capable of flattening an interlayer insulating film and improving processing precision without diffusing impurity ions over a wiring layer and the like.

Still another object of the present invention is to provide a method of manufacturing a semiconductor device capable of flattening an interlayer insulating film without reflow treatment.

A still further object of the present invention is to provide a method of manufacturing a semiconductor device capable of flattening an interlayer insulating film without implanting impurity ions in the interlayer insulating film.

A still further object of the present invention is to provide a method of manufacturing an MOSFET capable of flattening an interlayer insulating film without diffusing impurity ions over a wiring layer and the like.

A still further object of the present invention is to provide a method of manufacturing a semiconductor device having a multilayer wiring structure capable of flattening an interlayer insulating film without diffusing impurity ions over a wiring layer and the like.

A method of manufacturing a semiconductor device in accordance with the present invention comprises the steps of depositing a thick insulating film having a film thickness necessary for a convexo-concave pattern to be flattened on a semiconductor substrate comprising the convexo-concave pattern of an element, a wiring and the like; and etching the thick insulating film until it becomes a predetermined film thickness in order to form an interlayer insulating film having a predetermined film thickness out of the thick insulating film.

The manufacturing method in accordance with the present invention preferably comprises further a step of cleaning the surface of the interlayer insulating film.

In addition, the method in accordance with the present invention preferably further comprises a step of forming a thin silicon oxide film covering the convexo-concave pattern of the element, wiring and the like formed on the semiconductor substrate before the thick insulating film is deposited.

Since the present invention comprises the step of depositing a thick insulating film having a film thickness necessary for the convexo-concave pattern to be flattened on the semiconductor substrate comprising the convexo-concave pattern of the element, wiring and the like, an insulating film has been already flattened in the step of depositing the insulating film. In addition, since the flattened thick insulating film is uniformly etched until it becomes a predetermined film thickness, an interlayer insulating film having a flattened predetermined film thickness is formed. Therefore, the reflow treatment for flattening operation is not necessarily required. Also, it is not necessary to implant impurity ions in the insulating film to improve fluidity. Therefore, the impurity ions are not diffused over the wiring layer and the like when the insulating film is flattened.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2G are sectional views of a semiconductor device showing steps of a method of manufacturing the same in accordance with the second embodiment of the present invention;

FIG. 3 shows a profile of the concentration of boron in a silicon oxide film shown in FIGS. 2B and 2D;

FIGS. 4A to 4G are sectional views of a semiconductor device showing steps of a method of manufacturing the same in accordance with the third embodiment of the present invention;

FIGS. 5A to 5F are sectional views of a semiconductor device showing steps of a method of manufacturing the same in accordance with the fourth embodiment of the present invention;

FIGS. 8A to 8I are sectional views of a semiconductor device showing steps of a method of manufacturing the same in accordance with the first conventional example.

DESCRIPTION OF THE PREFERRED EMBODIMENTS

Referring to drawings, a description is given of embodiments of the present invention.

Embodiment 1

FIGS. 1A to 1J are sectional views of a semiconductor device showing its manufacturing steps in accordance with the first embodiment of the present invention.

Figure 1A:
FIGS. 1A to 1J are sectional views of a semiconductor device showing steps of a method of manufacturing the same in accordance with the first embodiment of the present invention.
Figure 1B:
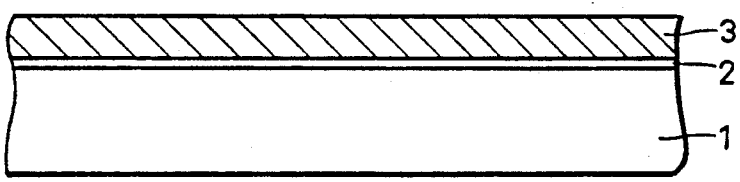

Referring to FIG. 1A, a semiconductor substrate 1, for example a silicon semiconductor substrate is prepared. Next, referring to FIG. 1B, a silicon oxide film 2 serving as a gate oxide film is formed on the semiconductor substrate 1. A polysilicon layer 3 serving as a gate electrode is formed on the silicon oxide film 2. Then, phosphorus is doped on the polysilicon layer 3 in order to enhance conductivity. Instead of doping phosphorus, polysilicon doped with phosphorus or arsenic may be deposited on the silicon oxide film 2.

Figure 1C:
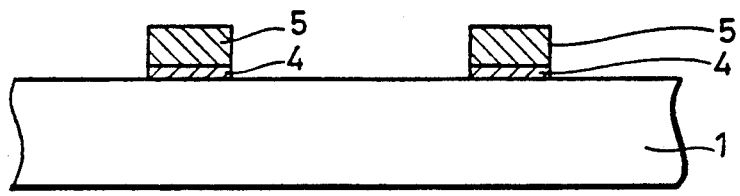

Referring to FIG. 1C, a gate oxide film 4 and a gate electrode 5 are formed on the semiconductor substrate 1 by patterning the silicon oxide film 2 and the polysilicon layer 3 into desired configurations.

Figure 1D:
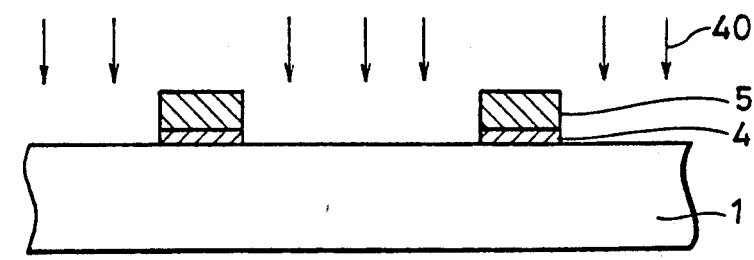

Referring to FIG. 1D, impurity ions 40 of $B^+$, $P^+$ or $As^+$ are implanted in the main surface of the semiconductor substrate 1 to form a source/drain region on the main surface of the semiconductor substrate 1.

Figure 1E:
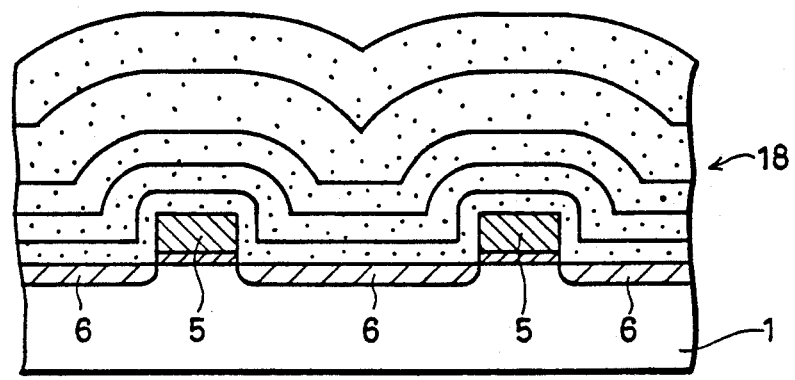

Referring to FIG. 1E, a silicon oxide film 18 is deposited on the semiconductor substrate 1 by CVD method using TEOS liquid or silane gas. The film thickness of the silicon oxide film 18 is made to be thicker than that necessary for a convexo-concave pattern of the gate electrode 5 and the like formed on the semiconductor substrate 1 to be flattened. This film thickness is more than approximately 1.5 times as thick as that necessary for an interlayer insulating film. When the thick silicon oxide film 18 is deposited on the semiconductor substrate 1 in this manner, a recess portion is buried and the surface of the uppermost layer of the silicon oxide film 18 is flattened.

Figure 1F:
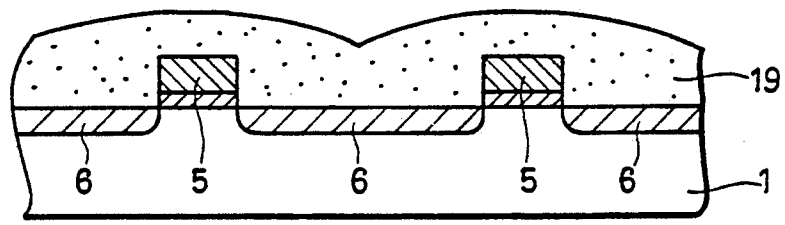
Figure 1G:
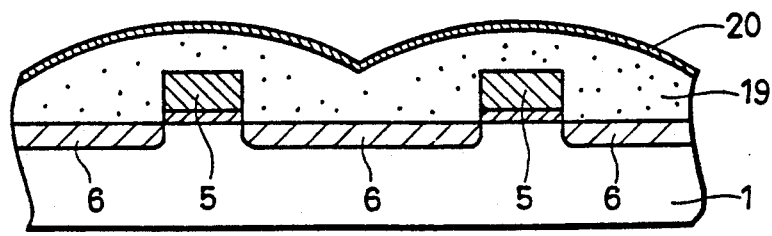

Meanwhile, although it is considered that a contact hole is formed in the state of FIG. 1F, it is difficult to manufacture the contact hole because it becomes too deep. Then, referring to FIGS. 1E and 1F, the silicon oxide film 18 is etched (by wet etching or dry etching) until it becomes a desired film thickness of approximately 3000~8000 Å. As a result, a thin interlayer insulating film 19 having a desired film thickness can be obtained Since the surface of the silicon oxide film 18 has already been flattened, the surface of the interlayer insulating film 19 obtained by etchback is also flattened. However, acid and water are attached to the surface of the interlayer insulating film 19 and soaked in its surface layer. This acid and water deteriorate the adhesion between a resist to be applied next and the interlayer insulating film 19. Then, referring to FIG. 1G, a new film 20 is formed on the interlayer insulating film 19 to cover the acid and water content. A silicon oxide film, a silicon oxy nitride film, a silicon nitride film or the combination of these is selected as the new film 20. Also, instead of forming the new film 20 on the interlayer insulating film 19, the water and acid absorbed in the interlayer insulating film 19 may be removed by heat treatment to clean the surface of the interlayer insulating film 19. In addition, the acid and water absorbed in the surface may be removed by oxidizing the surface of the interlayer insulating film 19 by $O_2$ plasma and $O_3$ annealing to clean the surface of the interlayer insulating film 19.

The oxidation treatment by $O_2$ plasma is significant when the interlayer insulating film 19 is formed between metals because, in this case, the heat treatment at high temperature is impossible.

Figure 1H:
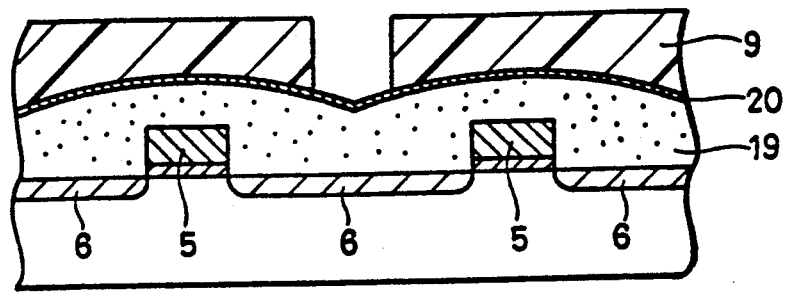

Referring to FIG. 1H, a resist 9 is formed on the interlayer insulating film 19 on which the new film 20 was formed. Since the surface of the interlayer insulating film 19 is cleaned by the new film 20, the adhesion between the interlayer insulating film 19 and the resist 9 is improved, so that processing precision of steps thereafter is improved. Then, the resist 9 is patterned such that an opening portion may be formed at the portion in which a contact hole is to be formed.

Figure 1I:
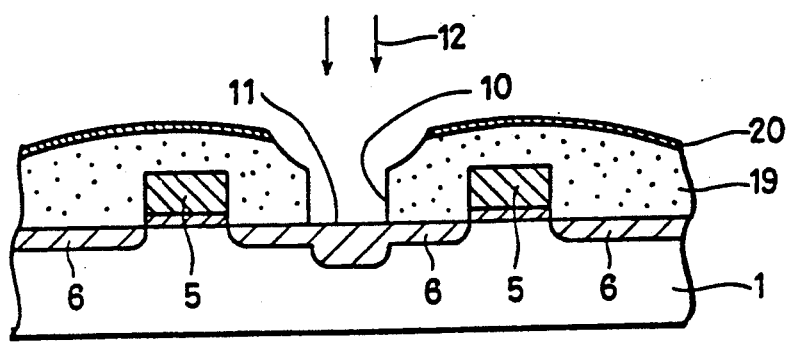

Referring to FIGS. 1H and 1I, the interlayer insulating film 19 is etched using the patterned resist 9 as a mask. Then, a contact hole 10 is formed in the interlayer insulating film 19. Then, the resist 9 is removed. After the resist 9 is removed, ions 12 of phosphorus or boron are implanted in a contact region.

Figure 1J:
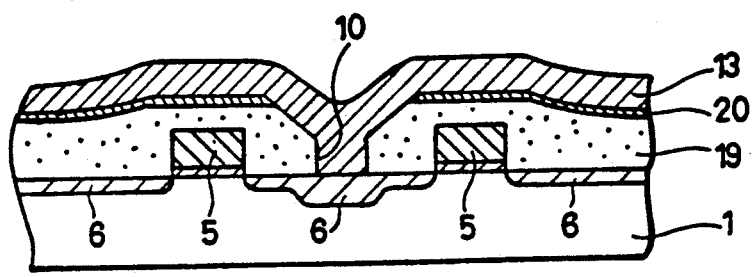

Thereafter, referring to FIG. 1J, an aluminum wiring pattern 13 is formed on the interlayer insulating film 19 comprising the contact hole 10. The aluminum wiring pattern 13 is electrically connected to the source/drain region 6 of a transistor through the contact hole 10. As described above, in this embodiment, referring to FIG. 1E, impurity ions are not implanted in the silicon oxide film 18. In addition, a high temperature heat treatment, called reflow, is not given. Therefore, the diffusion of the impurity ions over the gate electrode 5, which was observed in the prior art, can be avoided in flattening the interlayer insulating film. As a result, a semiconductor device can be provided with high reliability.

Embodiment 2

FIGS. 2A to 2G are sectional views of a semiconductor device showing its manufacturing steps in accordance with the second embodiment of the present invention.

First, the steps shown in FIGS. 1A to 1D are implemented. Then, referring to FIG. 2A, a silicon oxide film 22 comprising impurities such as boron, phosphorus, arsenic and the like is deposited on the semiconductor substrate 1. The concentration of the impurity ions are selected to be below $1 \times 10^{10}$ atom/cm$^3$. The film thickness of the silicon oxide film 22 is made to be thicker than that necessary for the convexo-concave pattern of the gate electrode 5 formed on the semiconductor substrate 1 to be flattened. This film thickness is more than approximately 1.5 times as thick as that necessary for an interlayer insulating film. When a thick silicon oxide film 22 is deposited on the semiconductor substrate in this manner, a recess portion is buried and the uppermost surface of the silicon oxide film 22 is flattened.

Referring to FIG. 2B, the step portion of the surface of the silicon oxide film 22 is sufficiently flattened and the silicon oxide film 22 itself is thermally shrunken by the heat treatment called reflow. A low temperature of approximately 600°~900° C. is enough for the reflow treatment because the film thickness of the silicon oxide film 22 is considerably thick. Although it is considered that a contact hole is formed in the state of FIG. 2B, it is difficult to manufacture it because the contact hole becomes too deep. Then, referring to FIGS. 2B and 2C, the silicon oxide film 22 is etched (by wet etching with hydrofluoric acid and the like or anisotropic dry etching) until it becomes a desired film thickness of approximately 3000~8000 Å). Then, a thin interlayer insulating film having a desired film thickness can be obtained. Since the silicon oxide film 22 is sufficiently flattened as described above, the interlayer insulating film obtained by the etchback of this is also sufficiently flattened. In addition, since the reflow treatment is given at a low temperature of approximately 600°~900° C., impurities introduced in the silicon oxide film 22 are hardly diffused over the gate electrode 5.

Figure 2D:
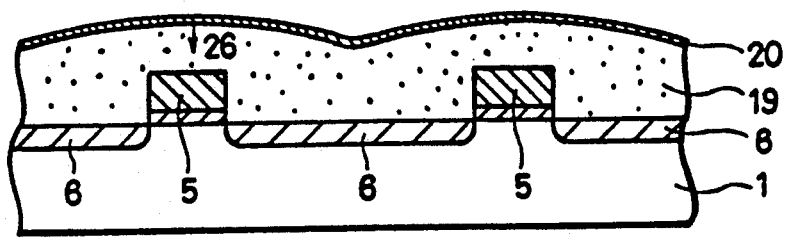

Meanwhile, acid and water used in etching treatment is attached to the surface of the interlayer insulating film 19 and soaked in its surface layer. This acid and water deteriorate the adhesion between a resist to be applied next and the interlayer insulating film 19. Referring to FIG. 2D, a new film 20 is formed on the interlayer insulating film 19 to cover the acid and water. Instead of forming the new film 20 on the interlayer insulating film 19, the water and acid absorbed in the interlayer insulating film 19 are removed by the heat treatment of 600°~900° C. to clean the surface of the interlayer insulating film 19. Also, similar to the embodiment 1, the acid and water absorbed in the surface may be removed by oxidizing the surface of the interlayer insulating film 19 by $O_2$ plasma and $O_3$ annealing.

Referring to FIG. 3, a description is given of an effect when the surface of the interlayer insulating film 19 is cleaned by the heat treatment of 600°~900° C. In FIG. 3, the abscissa X shows the film thickness of the silicon oxide film and the ordinate y shows the concentration of boron. The point A represents the surface of the silicon oxide film 22 after the reflow treatment and the point B represents the surface of the interlayer insulating film 19 after etching. A curve 23 represents a profile of the boron concentration from the surface of the silicon oxide film toward a direction shown by an arrow 25 in reference to FIG. 2B. A curve 24 represents a profile of the boron concentration from the surface toward a direction shown by an arrow 26 when the heat treatment is given on the interlayer insulating film 19 in reference to FIG. 2D. Referring to the curve 24, the boron concentration at the surface layer of the interlayer insulating film 19 is reduced by the heat treatment of the interlayer insulating film 19. Therefore, boron is hardly diffused over a wiring layer and the like to be formed later. As a result, the reliability of the semiconductor device is improved.

Referring to FIG. 2E again, a resist 9 is formed in the interlayer insulating film 19 on which the new film 20 was formed. Since the surface of the interlayer insulating film 19 is cleaned by the new film 20, the adhesion between the interlayer insulating film 19 and the resist 9 is improved and, therefore, processing precision of steps thereafter is improved. The resist 9 is patterned such that an opening portion may be formed at the portion in which a contact hole is to be formed.

Figure 2E:
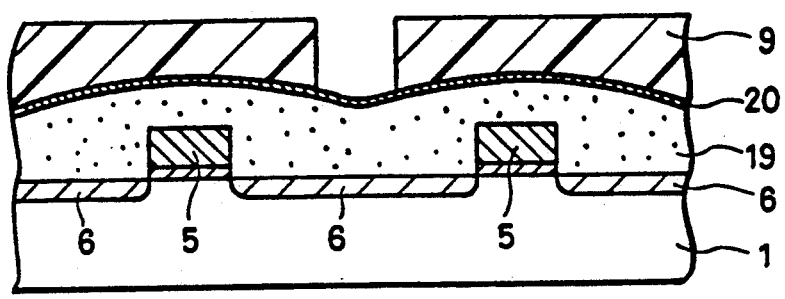
Figure 2F:
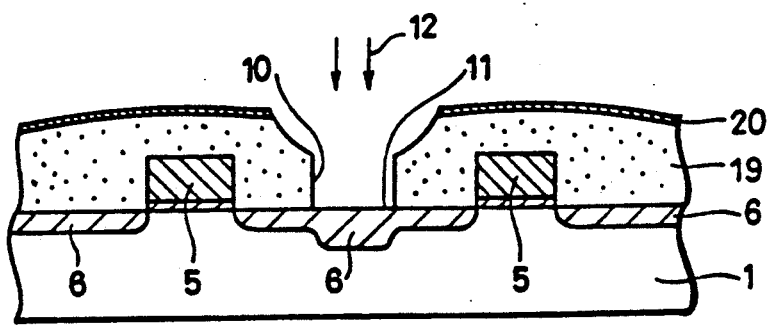

Referring to FIGS. 2E and 2F, a contact hole 10 is formed by etching the interlayer insulating film 19 using the pattern resist 9 as a mask. Thereafter, the resist 9 is removed. After the resist 9 is removed, ions 12 of phosphorus or boron are implanted in a contact region 11.

Figure 2G:
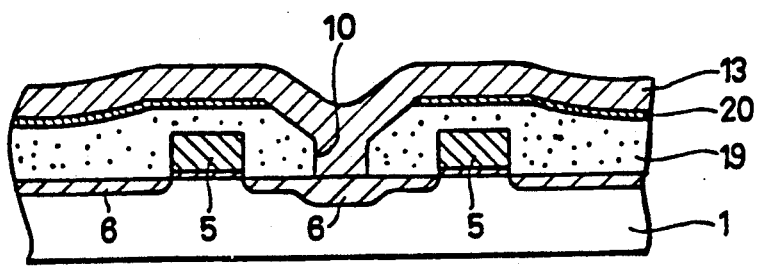

Referring to FIG. 2G, an aluminum wiring pattern 13 is formed on the interlayer insulating film 19 comprising the contact hole 10. The aluminum wiring pattern 13 is electrically connected to the source/drain region 6 of a transistor through the contact hole 10.

Embodiment 3

FIGS. 4A to 4G show the third embodiment of the present invention.

First, steps shown in FIGS. 1A to 1D are carried out. Then, referring to FIG. 4A, a thin silicon oxide film 27 is formed on a semiconductor substrate 1 comprising a gate electrode 5. Then, a silicon oxide film 22 comprising impurities of boron, phosphorous, arsenic and the like is deposited on the semiconductor substrate 1. The concentration of the impurity ions is selected to be below $1 \times 10^{10}$ atom/cm$^3$. The film thickness of the silicon oxide film 22 is made to be thicker than that necessary for a convexo-concave pattern of the gate electrode 5 formed on the semiconductor substrate 1 to be flattened.

The film thickness is more than approximately 1.5 times as thick as that necessary for an interlayer insulating film. Since the recess portion is buried when the thick silicon oxide film 18 is deposited on the semiconductor substrate 1 in this manner, the surface of the uppermost layer of the silicon oxide film is flattened.

Referring to FIG. 4B, the step portion of the surface of the silicon oxide film 22 is sufficiently flattened and the silicon oxide film 22 itself is also thermally shrunken by the heat treatment, called reflow to the silicon oxide film 22. A low temperature of approximately 600°~900° C. is enough for the heat treatment because the film thickness of the silicon oxide film 22 is thick.

Figure 4D:
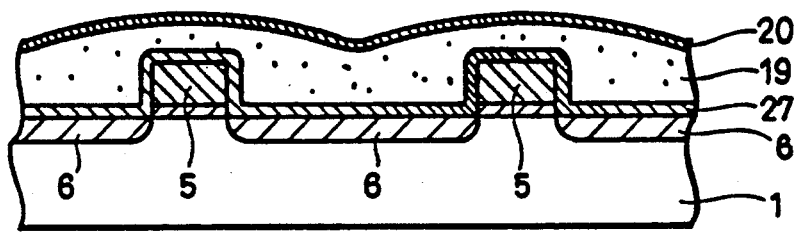

Meanwhile, although it is considered that a contact hole is formed in the state of FIG. 4B, it is difficult to manufacture the contact hole because it becomes too deep. Then, referring to FIGS. 4B and 4C, the silicon oxide film 22 is etched (by wet etching or dry etching) until it becomes a desired film thickness of approximately 3000~8000 Å. Then, a thin interlayer insulating film 19 having a desired film thickness can be obtained. Since the surface of the silicon oxide film 22 is flattened, the surface of the interlayer insulating film 19 obtained by etching this is also flattened. However, acid and water are attached on the surface of the interlayer insulating film 19 and soaked in its surface layer. The existence of the acid and water deteriorates adhesion between a resist to be applied next and the interlayer insulating film 19. Then, referring to FIG. 4D, a new layer 20 is formed on the interlayer insulating film 19 to cover the acid and water. Instead of forming the new film 20 on the interlayer insulating film 19, the water and acid absorbed in the interlayer insulating film 19 may be removed to clean the surface of the interlayer insulating film 19 by heat treatment. Also, the acid and water absorbed in the surface may be removed by oxidizing the surface of the interlayer insulating film 19 by $O_2$ plasma or $O_3$ annealing.

Figure 4E:
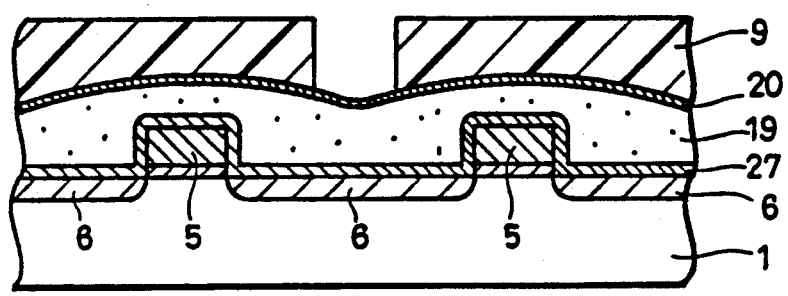

Referring to FIG. 4E, a resist 9 is formed on the interlayer insulating film 19 on which the new film 20 was formed. Since the surface of the interlayer insulating film 19 is cleaned by the new film 20, the adhesion between the interlayer insulating film 19 and the resist 9 is improved and processing precision of steps thereafter is also improved. Then, the resist 9 is patterned such that an opening portion may be formed at a portion in which a contact hole is to be formed.

Figure 4F:
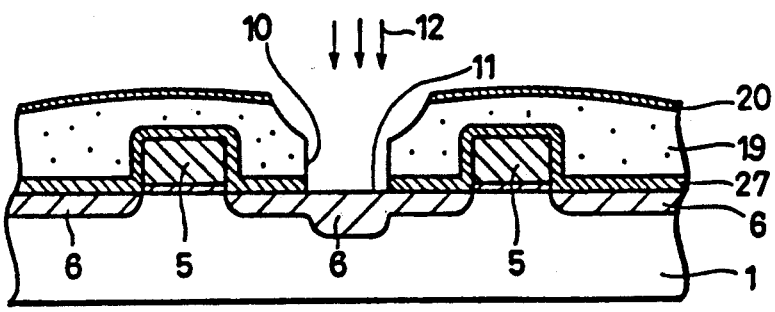

Referring to FIGS. 4E and 4F, a contact hole 10 is formed by etching the interlayer insulating film 19 using the patterned resist 9 as a mask. Thereafter, the resist 9 is removed. After the resist is removed, ions 12 of phosphorus or boron are implanted in a contact region 11.

Figure 4G:
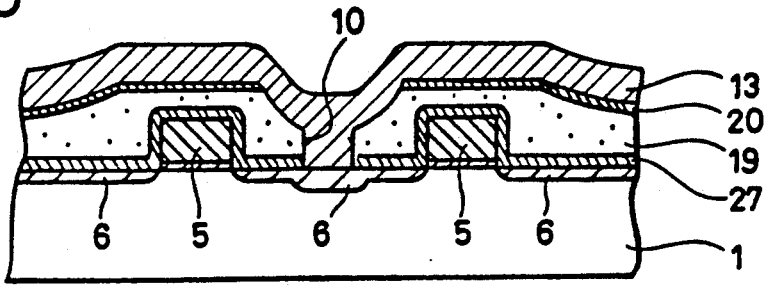

Referring to FIG. 4G, an aluminum wiring pattern 13 is formed on the interlayer insulating film 19 comprising the contact hole. This aluminum wiring pattern 13 is electrically connected to the source/drain region 6 of a transistor through the contact hole 10.

As described above, since the thin silicon oxide film 27 is formed on the semiconductor substrate 1 comprising the gate electrode 5 in this embodiment in reference to FIG. 4A, impurity ions contained in the silicon oxide film 22 are shut off by the thin silicon oxide film 27 and they are not diffused over the gate electrode 5 and the source/drain region 6. As a result, the reliability of the semiconductor device is improved more.

Embodiment 4

FIGS. 5A to 5F show the fourth embodiment of the present invention.

First, steps shown in FIGS. 1A to 1D are carried out. Then, referring to FIG. 5A, a thin silicon oxide film 27 is formed on a semiconductor substrate 1 comprising a gate electrode 5. Thereafter, a silicon oxide film 18 is deposited on the semiconductor substrate 1. Impurities are not contained in the silicon oxide film 18. The film thickness of the silicon oxide film 18 is made to be thicker than that necessary for a convexo-concave pattern of the gate electrode 5 formed on the semiconductor substrate 1 to be flattened. The film thickness is more than approximately 1.5 times as thick as that necessary for an interlayer insulating film. When such a thick silicon oxide film 18 is deposited on the semiconductor substrate 1, a recessed portion is buried and the step portion of the surface of the uppermost layer of the silicon oxide film 18 is flattened.

Figure 5D:
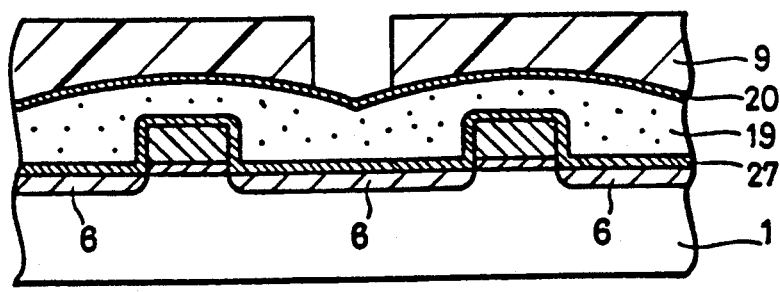

Although it is considered that a contact hole is formed in the state of FIG. 5A, it is difficult to manufacture the contact hole because it becomes too deep. Then, referring to FIGS. 5A and 5B, the silicon oxide film 18 is etched (by wet etching or dry etching) until it becomes a desired film thickness of approximately 3000~8000 Å. Then, a thin interlayer insulating film 19 having a desired film thickness can be obtained. Since the surface of the silicon oxide film 18 is flattened, the surface of the interlayer insulating film obtained by etching this is also flattened. However, acid and water are attached on the surface of the interlayer insulating film and soaked in its surface layer. This acid and water deteriorate the adhesion between a resist to be applied next and the interlayer insulating film 19. Then, referring to FIG. 5C, a new film 20 is formed on the interlayer insulating film 19 to cover the acid and water. Instead of forming the new film 20 on the interlayer insulating film 19, the water and the acid absorbed in the interlayer insulating film 19 are removed to clean the surface of the interlayer insulating film 19 by heat treatment. Also, the acid and water absorbed in the surface may be removed by oxidizing the surface of the interlayer insulating film 19 by $O_2$ plasma or $O_3$ annealing. Then, referring to FIG. 5D, a resist 9 is formed on the interlayer insulating film 19 on which the new film 20 was formed. Since the surface of the interlayer insulating film 19 is cleaned by the new film 20, the adhesion between the interlayer insulating film 19 and the resist 9 is improved and also processing precision of steps thereafter is improved. The resist 9 is patterned such that an opening portion may be formed at the portion in which a contact hole is to be formed.

Figure 5E:
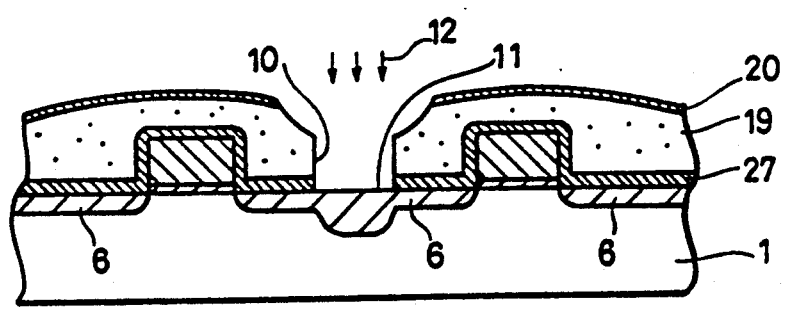

Referring to FIGS. 5D and 5E, a contact hole 10 is formed by etching the interlayer insulating film 19 using the patterned resist 9 as a mask. Thereafter, the resist 9 is removed. After the resist 9 is removed, ions 12 of phosphorus or boron are implanted in a contact region 11.

Figure 5F:
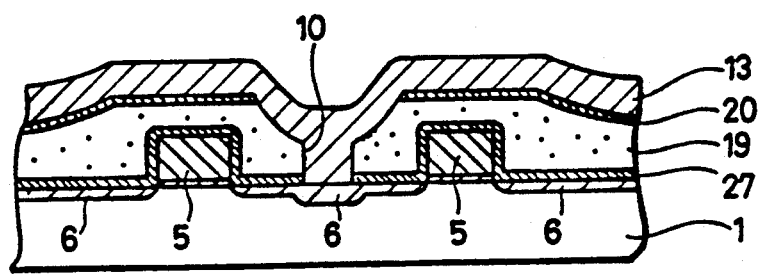

Referring to FIG. 5F, an aluminum wiring pattern 13 is formed on the interlayer insulating film 19 comprising the contact hole 10. The aluminum wiring pattern 13 is electrically connected to a source/drain region 6 of a transistor through the contact hole 10.

In this embodiment, referring to FIG. 5A, a thin silicon oxide film 27 is formed on the semiconductor substrate 1 comprising the gate electrode 5. In addition, impurities are not implanted in the thick silicon oxide film 18. Also, the reflow treatment is not given. Therefore, impurities are not diffused over the gate electrode 5 and the source/drain region 6.

Embodiment 5

Figure 6H:
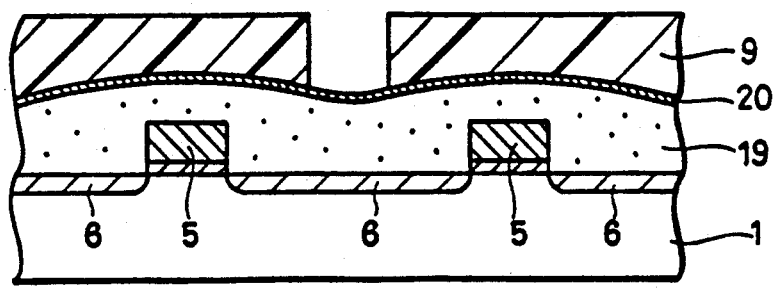
FIGS. 6A to 6Q are sectional views of the steps of the fifth embodiment in which the present invention is applied to a method of manufacturing a semiconductor device having a multilayer wiring structure.
Figure 6I:
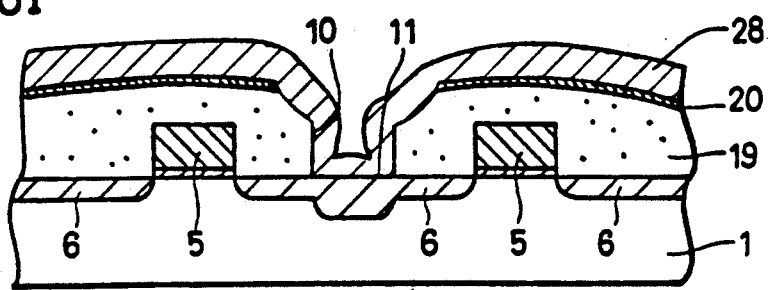
Figure 6J:
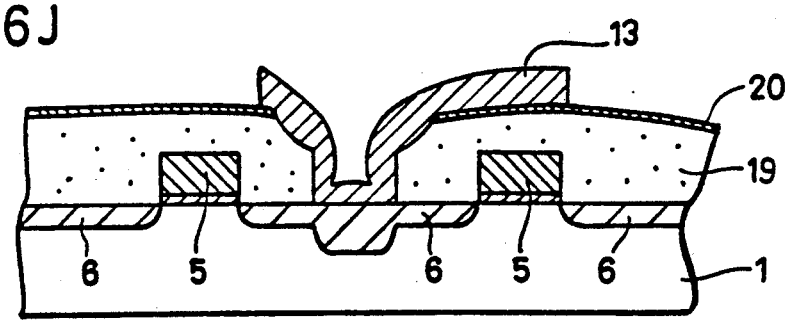
Figure 6K:
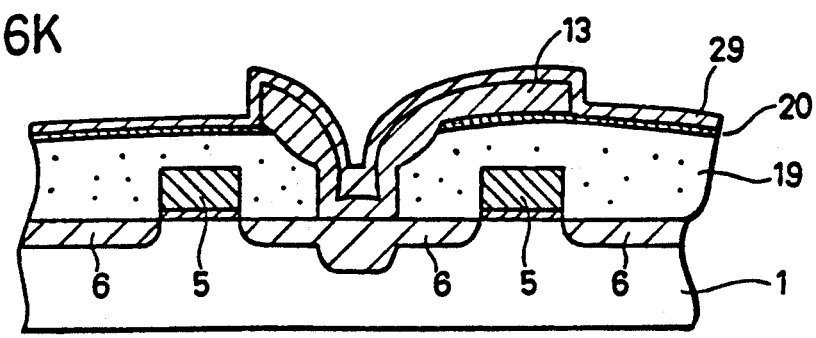
Figure 6L:
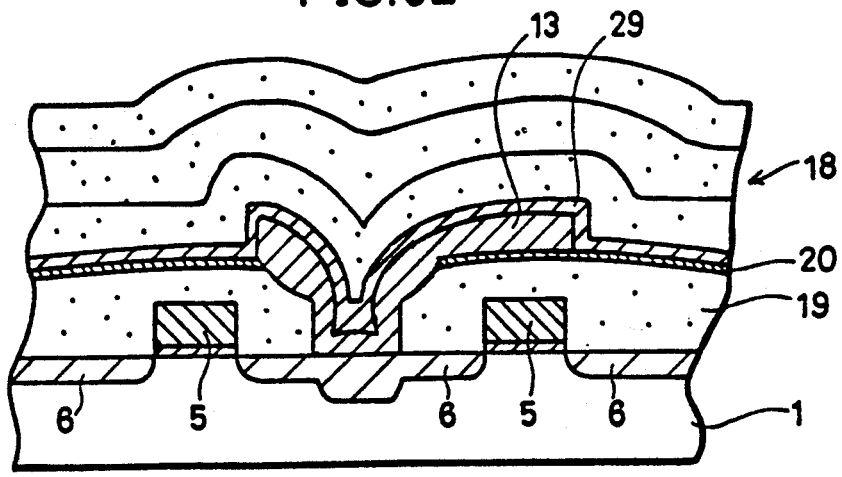
Figure 6M:
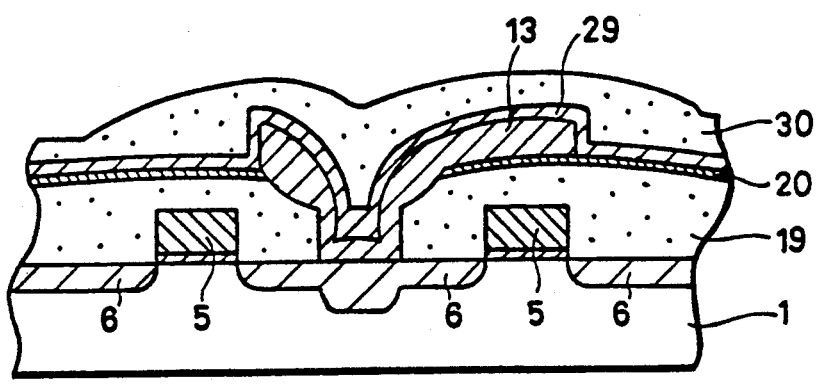
Figure 6N:
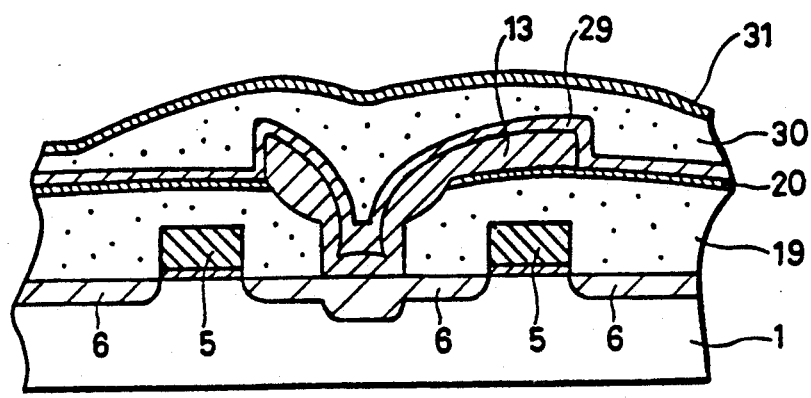
Figure 6O:
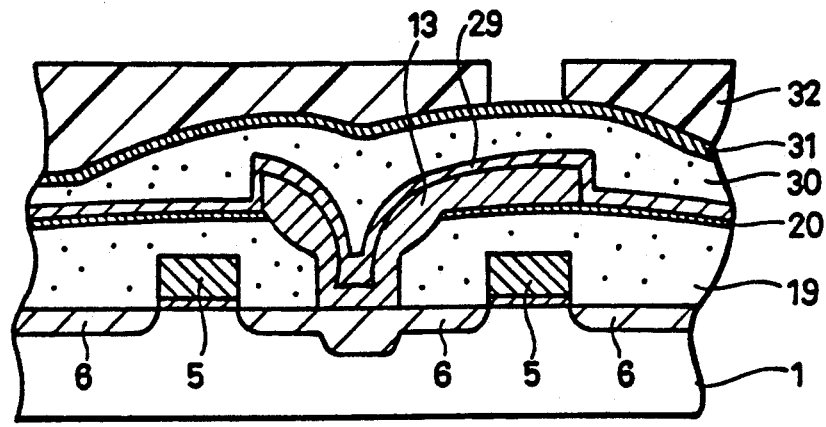
Figure 6P:
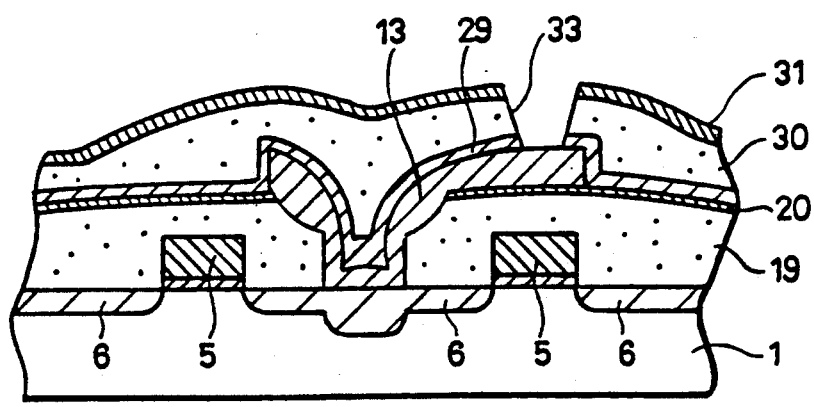
Figure 6Q:
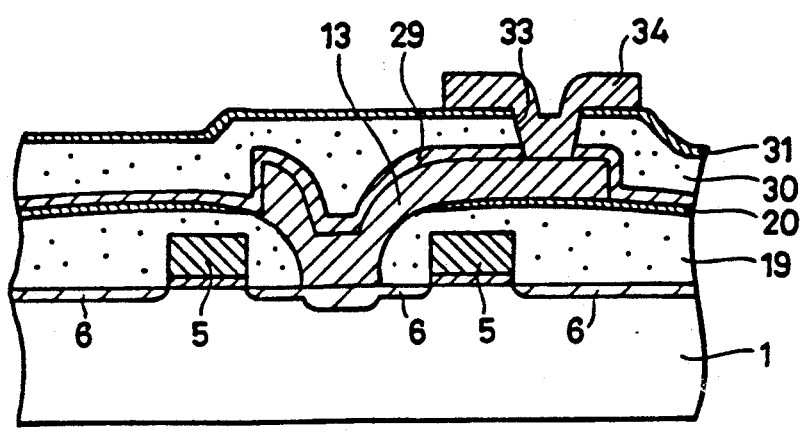

FIGS. 6A to 6Q are the fifth embodiment in which the present invention is applied to a method of manufacturing a semiconductor device having a multilayer wiring structure.

Referring to FIG. 6A, a semiconductor substrate 1, for example a silicon semiconductor substrate is prepared. Then, referring to FIG. 6B, a silicon oxide film 2 serving as a gate oxide film is formed on the semiconductor substrate 1. A polysilicon layer 3 serving as a gate electrode is formed on the silicon oxide film 2. Then, the polysilicon layer 3 is doped with phosphorus for enhancing conductivity. Instead of doping phosphorus, polysilicon doped with phosphorus or arsenic may be deposited on the silicon oxide film 2.

Referring to FIGS. 6B and 6C, a gate oxide film 4 and a gate electrode 5 are formed on the semiconductor substrate 1 by patterning the silicon oxide film 2 and the polysilicon layer 3 into desired configurations.

Referring to FIG. 6D, impurity ions 40 of $B^+$, $P^+$ or $AS^+$ are implanted in the main surface of the semiconductor substrate to form a source/drain region 6 on the main surface of the semiconductor substrate 1.

Referring to FIG. 6E, a silicon oxide film 22 comprising impurities of boron, phosphorus, arsenic and the like is deposited on the semiconductor substrate 1. The concentration of the impurities is selected to be below $1 \times 10^{20}$ atom/cm$^3$. The film thickness of the silicon oxide film 22 is made to be thicker than that necessary for a convexo-concave pattern of the gate electrode 5 formed on the semiconductor substrate 1 to be flattened. The film thickness is more than approximately 1.5 times as thick as that necessary for an interlayer insulating film. When such a thick silicon oxide film 22 is deposited on the semiconductor substrate 1, a recessed portion is buried to flatten the step portion of the uppermost layer of the silicon oxide film 22.

Referring to FIG. 6F, the step portion of the surface of the silicon oxide film 22 is sufficiently flattened and also the silicon oxide film 22 itself is thermally shrunken by applying heat treatment, called reflow, to a silicon oxide film 22. A low temperature of approximately 600°~900° C. is enough for the heat treatment because the film thickness of the silicon oxide film 22 is considerably thick.

Although it is considered that a contact hole is formed in the state of FIG. 6F, it is difficult to manufacture the contact hole because it becomes too deep. Referring to FIGS. 6F and 6G, the silicon oxide film 22 is etched (by wet etching or dry etching) until it becomes a predetermined film thickness of approximately 3000~8000 Å. Then, a thin interlayer insulating film 19 having a desired film thickness can be obtained. Since the surface of the silicon oxide film 22 is flattened, the surface of the multilayer insulating film 19 obtained by etching this is also flattened. However, acid and water are attached to the surface of the interlayer insulating film 19 and soaked in the surface layer of the interlayer insulating film 19. These acid and water deteriorate the adhesion between a resist to be applied next and the interlayer insulating film 19. Referring to FIG. 6G, a new film 20 is formed on the interlayer insulating film 19 to cover the acid and water. Instead of forming the new film on the interlayer insulating film 19, the water and acid absorbed in the interlayer insulating film 19 are removed to clean the surface of the interlayer insulating film 19 by heat treatment. Alternatively, the acid and water absorbed in the surface may be removed by oxidizing the surface of the interlayer insulating film 19 by $O_2$ plasma $O_3$ annealing.

Referring to FIG. 6H, a resist 9 is formed on the interlayer insulating film 19 on which the new film 20 was formed. Since the surface of the interlayer insulating film 19 is cleaned by the new film, the adhesion between the interlayer insulating film 19 and the resist 9 is improved and also processing precision thereafter is also improved. Then, the resist 9 is patterned such that an opening portion may be formed at the portion in which a contact hole is to be formed.

Referring to FIGS. 6H and 6I, a contact hole 10 is formed by etching the interlayer insulating film 19 using the pattern resist 10 as a mask. Thereafter, the resist 9 is removed. After the resist 9 is removed, ions of phosphorus or boron are implanted in a contact region 11.

Referring to FIG. 6I, an aluminum wiring layer 28 is formed on the interlayer insulating film 19 comprising the contact hole 10.

Referring to FIG. 6J, an aluminum wiring pattern 13 is formed by patterning the aluminum wiring layer 28 into a desired configuration.

Referring to FIG. 6K, a silicon oxide film 29 is formed on the semiconductor substrate 1 comprising the aluminum wiring pattern 13.

Referring to FIG. 6L, a silicon oxide film 18 is formed on the semiconductor substrate 1. Impurity ions are not contained in the silicon oxide film 18. The film thickness of the silicon oxide film 18 is made to be thicker than that necessary for a convexo-concave pattern of the aluminum wiring pattern 13 to be flattened. The film thickness is more than approximately 1.5 times as thick as that necessary for an interlayer insulating film. When such a thick silicon oxide film 18 is deposited on the semiconductor substrate, a recessed portion is buried to flatten the step portion of the surface of the uppermost layer of the silicon oxide film 18.

Although it is considered that a through hole is formed in the state of FIG. 6L, it is difficult to manufacture the through hole because it becomes too deep. Then, referring to FIGS. 6L and 6M, the silicon oxide film 18 is etched (by wet etching or dry etching) until it becomes a predetermined film thickness of approximately 3000~8000 Å. Then, a thin interlayer insulating film 30 having a desired film thickness can be obtained. Since the surface of the silicon oxide film 18 is flattened, the surface of the interlayer insulating film 30 obtained by etching this is also flattened. However, acid and water are attached to the surface of the interlayer insulating film 30 and soaked in the surface layer of the interlayer insulating film 30. This acid and water deteriorate the adhesion between the resist to be applied next and the interlayer insulating film 30. Then, referring to FIG. 6N, a new film 31 is formed on the interlayer insulating film 30 to cover the acid and water. Instead of forming the new film 31 on the interlayer insulating film 30, the water and acid absorbed in the interlayer insulating film 30 are removed to clean the surface of the interlayer insulating film 30 by heat treatment. Alternatively, the acid and water absorbed in the surface may be removed by oxidizing the surface of the interlayer insulating film 30 by $O_2$ plasma or $O_3$ annealing.

Referring to FIG. 6O, a resist 32 is formed on the interlayer insulating film 30 on which the new film 31 was formed. Since the surface of the interlayer insulating film 30 is cleaned by the new film 31, the adhesion between the interlayer insulating film 30 and the resist 32 is improved and processing precision of steps thereafter is also improved. Then, the resist 32 is patterned such that an opening portion is formed at the portion in which a through hole is to be formed.

Referring to FIGS. 6O and 6P, a through hole 33 is formed by etching the interlayer insulating film 30 using the pattern resist 32 as a mask.

Referring to FIG. 6Q, an aluminum wiring pattern 34 is formed on the interlayer insulating film 30 comprising the through hole 33. The aluminum wiring pattern 34 is electrically connected to an aluminum wiring pattern 13 through the through hole 33.

In this embodiment also, when the interlayer insulating films 19 and 30 are flattened, impurity ions are not diffused over the wiring layer and it is possible to obtain a semiconductor device with high reliability.

Embodiment 6

FIGS. 7A to 7F are the sixth embodiment in which the present invention is applied to a method of manufacturing a semiconductor device having a multilayer wiring structure.

First, steps shown in FIGS. 6A to 6K are carried out. Then, referring to FIG. 7A, a silicon oxide film 18 is deposited on the semiconductor substrate 1. Impurities are not contained in the silicon oxide film 18. The film thickness of the silicon oxide film 18 is made to be thicker than that necessary for a convexo-concave pattern of the aluminum wiring pattern 13 to be flattened. The film thickness is more than approximately 1.5 times as thick as that necessary for an interlayer insulating film. When such a thick silicon oxide film 18 is deposited on the semiconductor substrate 1, a recessed portion is buried to flatten the step portion of the surface of the uppermost layer of the silicon oxide film 18.

Figure 7A:
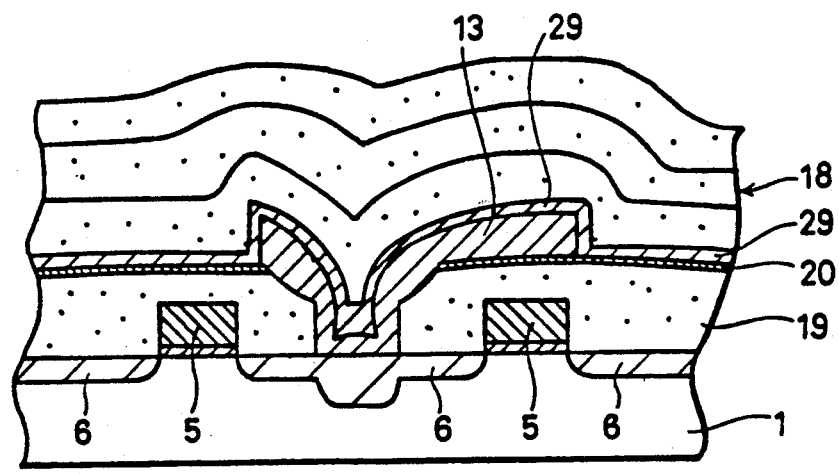
FIGS. 7A to 7F are sectional views of the steps of the sixth embodiment in which the present invention is applied to a method of manufacturing a semiconductor device having a multilayer wiring structure.
Figure 7B:
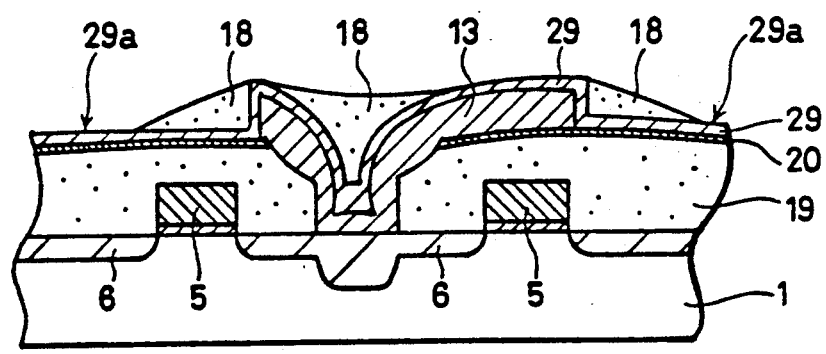
Figure 7C:
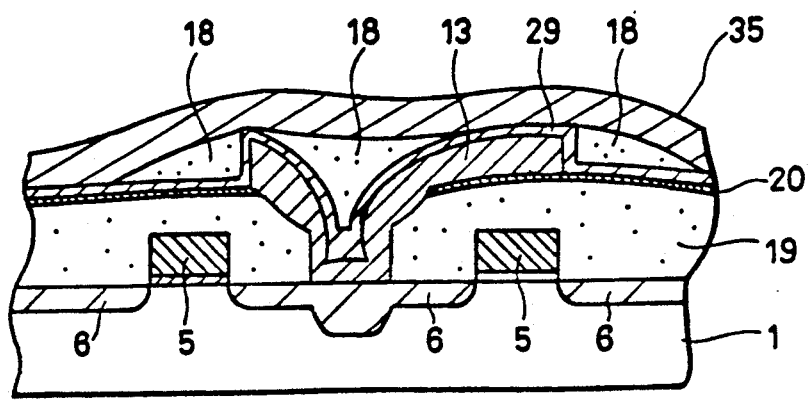

Referring to FIG. 7B, the silicon oxide film 18 is etched until a flat portion 29a of the silicon oxide film 29 is exposed. Then, a recessed portion of the aluminum wiring pattern 13 is buried with the silicon oxide film 18 and flattened. Referring to FIG. 7C, a silicon oxide film 35 of 1000~3030 Å in thickness is deposited on the whole surface of the semiconductor substrate 1 by a plasma CVD method. Then, referring to FIG. 7D, a resist 9 is formed on the silicon oxide film 35. The surface of the silicon oxide film 35 is beautiful. Therefore, the adhesion between the silicon oxide film 35 and the resist 9 is large. Then, the resist pattern 9 is patterned such that an opening portion may be formed at a portion in which a through hole is to be formed.

Figure 7D:
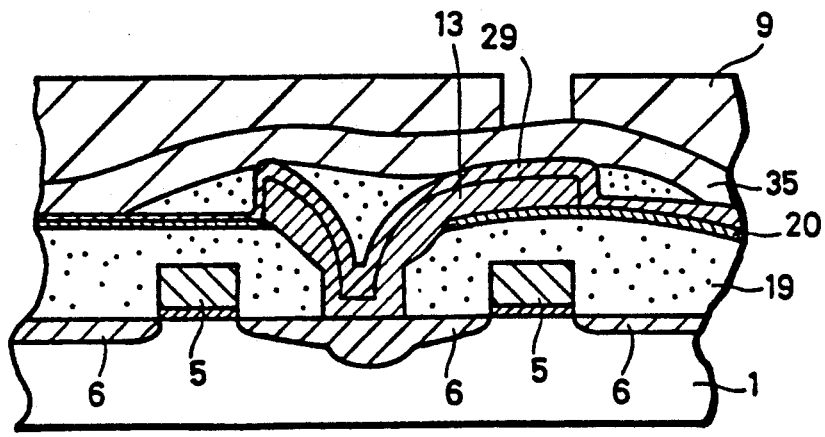
Figure 7E:
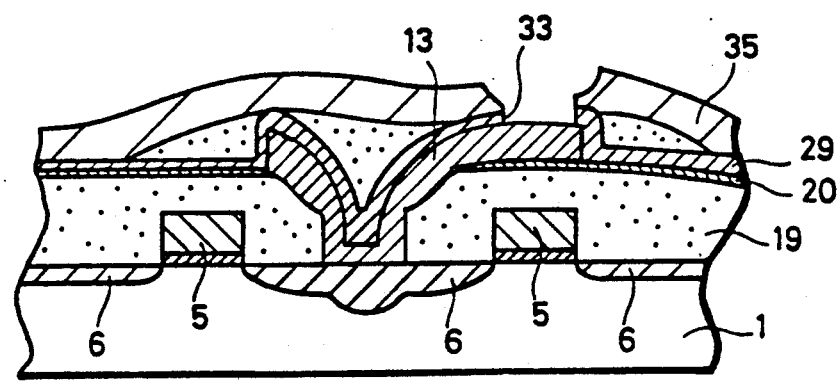
Figure 7F:
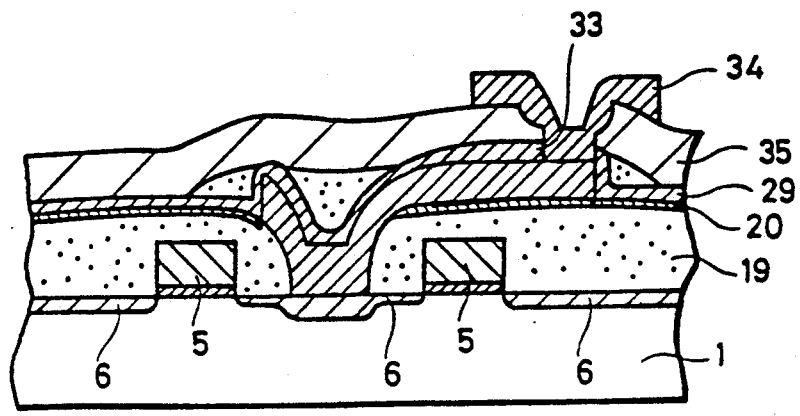
Figure 9A:
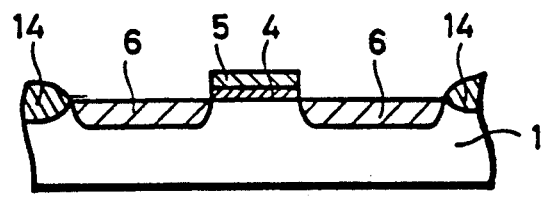
FIGS. 9A to 9F are sectional views of a semiconductor device showing steps of a method of manufacturing the same in accordance with the second conventional example.
Figure 9B:
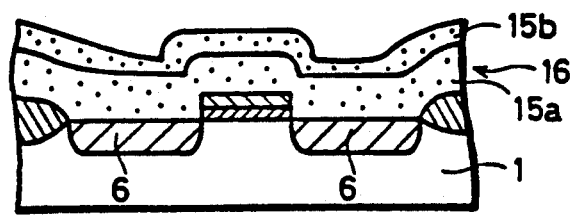
Figure 9C:
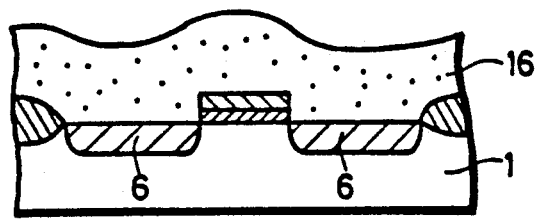
Figure 9D:
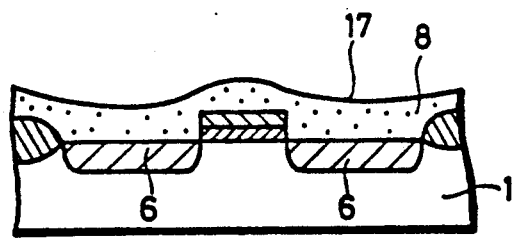
Figure 9E:
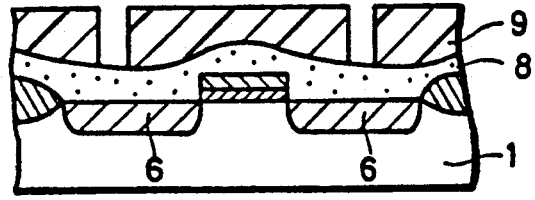
Figure 9F:
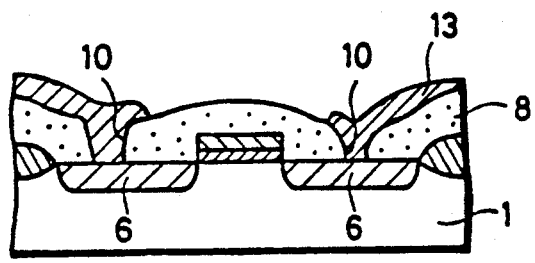

Referring to FIGS. 7D and 7E, a through hole 33 is formed by etching the silicon oxide film 35 using the patterned resist 9 as a mask.

Referring to FIG. 7E, an aluminum wiring pattern 34 is formed on the silicon oxide film 35 comprising the through hole 33. This aluminum wiring pattern 34 is electrically connected to an aluminum wiring pattern 13 through the through hole 33.

In the above described embodiment also, when the interlayer insulating film is flattened, impurity ions are not diffused over the wiring layer and the like, so that it is possible to obtain a semiconductor device with high reliability.

As described above, according to the present invention, since a thick insulating film having a film thickness necessary for a convexo-concave pattern to be flattened is deposited on a semiconductor substrate comprising the convexo-concave pattern of an element, a wiring and the like, the surface of the insulating film has been already flattened at the time of deposition of the insulating film. Since this flattened thick insulating film is uniformly etched until it becomes a predetermined film thickness, an interlayer insulating film having a flattened predetermined film thickness is formed. Therefore, the reflow treatment for flattening is not necessarily required. In addition, it is not necessary to implant impurity ions for enhancing fluidity in the insulating film. Therefore, when the interlayer insulating film is flattened, impurity ions are not diffused over the wiring layer and the like. As a result, there is an effect that it is possible to obtain a semiconductor device with high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device which includes a convexo-concave patterned element formed on a substrate and a flattened interlayer insulating film of a predetermined thickness over the substrate formed on the patterned element and the substrate, said method comprising the steps of:
   depositing a thick insulating film on a semiconductor substrate having a convexo-concave patterned element, said thick insulating film having a thickness which is more than approximately 1.5 times said predetermined thickness over the substrate and which is sufficiently large that the uppermost surface of the thick insulating film is flattened;
   etching the entire surface of the thick insulating film until it is of said predetermined thickness over the substrate in order to form a flattened interlayer insulating film having said predetermined thickness from said thick insulating film; and
   after said etching, conducting a treatment selected from the following (a), (b), (c) and (d) on the surface of the flattened interlayer insulating film:
   (a) forming a thin film on said flattened interlayer insulating film to conceal acid and water which have permeated into the surface of said flattened interlayer insulating film;
   (b) heat treating the surface of said flattened interlayer insulating film at a temperature of 600°~900° C. to remove acid and water which have permeated into the surface of said flattened interlayer insulating film;
   (c) treating the surface of said flattened interlayer insulating film with $O_2$ plasma to remove acid and water which have permeated into the surface of said flattened interlayer insulating film; and
   (d) annealing the surface of said flattened interlayer insulating film in an $O_3$ gas atmosphere to remove acid and water which have permeated into the surface of said flattened interlayer insulating film.

2. A method in accordance with claim 1, further comprising the step of:
   forming a resist on the surface of said treated flattened interlayer insulating film.

3. A method in accordance with claim 1, wherein said thin film is selected from the group consisting of a silicon oxide film, a silicon oxy nitride film and a silicon nitride film.

4. A method in accordance with claim 1, further comprising the step of forming a thin silicon oxide film on said semiconductor substrate so as to cover the convexo-concave pattern of said element before the deposition of said thick insulating film.

5. A method in accordance with claim 4, wherein said thick insulating film is formed of a silicon oxide film comprising impurities.

6. A method in accordance with claim 5, wherein said impurities are selected from the group consisting of boron, phosphorus and arsenic.

7. A method in accordance with claim 5, further comprising the step of smoothing the surface of said thick insulating film by heat treatment before etching of said thick insulating film.

8. A method of manufacturing a semiconductor device having a multilayer wiring structure, said semiconductor device including a convexo-concave patterned element formed on a substrate and a flattened first interlayer insulating film of a first predetermined thickness over the substrate formed on the patterned element and the substrate, said method comprising the steps of:
   depositing a first thick insulating film on a semiconductor substrate having a convexo-concave patterned element, said first thick insulating film having a thickness which is more than approximately 1.5 times said first predetermined thickness over the substrate and which is sufficiently large that the uppermost surface of the first thick insulating film is flattened;
   etching the entire thickness of said first thick insulating film until it is of said first predetermined film thickness over the substrate in order to form a flattened first interlayer insulating film having said first predetermined thickness from said first thick insulating film; and
   after said etching, conducting a treatment selected from the following (a), (b), (c) and (d) on the surface of the flattened first interlayer insulating film:
   (a) forming a thin film on said flattened first interlayer insulating film to conceal acid and water which have permeated into the surface of said flattened first interlayer insulating film;
   (b) heat treating the surface of said flattened first interlayer insulating film at a temperature of 600°~900° C. to remove acid and water which have permeated into the surface of said flattened first interlayer insulating film;
   (c) treating the surface of said flattened first interlayer insulating film with $O_2$ plasma to remove acid and water which have permeated into the surface of said flattened first interlayer insulating film; and
   (d) annealing the surface of said flattened first interlayer insulating film in an $O_3$ atmosphere to remove acid and water which have permeated into the surface of said flattened first interlayer insulating film.

9. A method in accordance with claim 8, further comprising the steps of:
   forming a contact hole on said treated, flattened first interlayer insulating film;
   forming a first wiring pattern electrically connected to said patterned element through said contact hole on said treated, flattened first interlayer insulating film;
   forming a thin insulating film on said first wiring pattern; and
   forming on said thin insulating film a second thick insulating film having a film thickness which is more than approximately 1.5 times a second predetermined thickness and which is sufficiently large that the upper surface of the second thick insulating film is flattened.

10. A method in accordance with claim 9, further comprising the step of etching said second thick insulating film until it is of said second predetermined film thickness in order to form a second interlayer insulating film having said second predetermined film thickness from said second thick insulating film.

11. A method in accordance with claim 10, further comprising the steps of:
   cleaning the surface of said second interlayer insulating film;
   forming a through hole in said second interlayer insulating film; and
   forming on said second interlayer insulating film a second wiring pattern electrically connected to said first wiring pattern through said through hole.

12. A method in accordance with claim 11, wherein said step of cleaning the surface of said second interlayer insulating film comprises the step of forming a new film on said second interlayer insulating film.

13. A method in accordance with claim 9, further comprising the steps of:
   etching said second thick insulating film until a flat portion of said thin insulating film is exposed;
   forming a third insulating film having a third predetermined film thickness after said second thick insulating film is etched;
   forming a through hole in said third insulating film; and
   forming on said third insulating film a second wiring pattern electrically connected to said first wiring pattern through said through hole.

* * * * *